United States Patent
Flessner

(10) Patent No.: US 9,627,299 B1
(45) Date of Patent: Apr. 18, 2017

(54) STRUCTURE AND METHOD FOR DIMINISHING DELAMINATION OF PACKAGED SEMICONDUCTOR DEVICES

(71) Applicant: Texas Instruments Incorporated, Dallas, TX (US)

(72) Inventor: Kyle Mitchell Flessner, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/041,229

(22) Filed: Feb. 11, 2016

(51) Int. Cl.
H01L 23/49 (2006.01)
H01L 23/495 (2006.01)
H01L 23/00 (2006.01)
H01L 23/31 (2006.01)
H01L 21/48 (2006.01)
H01L 21/56 (2006.01)

(52) U.S. Cl.
CPC ...... *H01L 23/4952* (2013.01); *H01L 21/4853* (2013.01); *H01L 21/56* (2013.01); *H01L 23/3157* (2013.01); *H01L 23/49534* (2013.01); *H01L 23/49582* (2013.01); *H01L 24/46* (2013.01); *H01L 2224/48091* (2013.01); *H01L 2224/4945* (2013.01)

(58) Field of Classification Search
CPC ..... H01L 23/4952; H01L 24/46; H01L 21/56; H01L 21/4853; H01L 23/3157; H01L 23/49534; H01L 23/49582; H01L 2224/4945; H01L 2224/48091
See application file for complete search history.

(56) References Cited

U.S. PATENT DOCUMENTS

| 8,058,706 | B2 | 11/2011 | Feng et al. | |
| 8,975,734 | B2 | 3/2015 | Tsai et al. | |
| 2007/0013067 | A1* | 1/2007 | Nishida | H01L 21/563 257/737 |
| 2007/0035019 | A1* | 2/2007 | Carney | H01L 23/3121 257/734 |
| 2013/0154068 | A1* | 6/2013 | Sanchez | H01L 23/4334 257/675 |
| 2013/0277838 | A1* | 10/2013 | Yu | H01L 24/13 257/738 |
| 2015/0200181 | A1* | 7/2015 | Haga | B23K 20/005 438/127 |

* cited by examiner

*Primary Examiner* — Roy Potter
*Assistant Examiner* — Paul Patton
(74) *Attorney, Agent, or Firm* — Rose Alyssa Keagy; Charles A. Brill; Frank D. Cimino

(57) ABSTRACT

A semiconductor device (100) comprising a leadframe with a pad (101) and elongated leads (103) made of a base metal plated with a layer enabling metal-to-metal bonding; a semiconductor chip (110) attached to the pad, the chip having terminals. A metallic wire connection (130) from a terminal to a respective lead, the connection including a first ball bond by a first squashed ball (131) attached to the terminal, and a first stitch bond (132) attached to the lead. A second squashed ball (150) of the wire metal attached to the lead as a second ball bond adjacent to the first stitch bond (132). A package (170) of a polymeric compound encapsulating the chip, wire connection, second ball and at least a portion of the elongated lead, the compound adhering to the materials of the encapsulated entities.

20 Claims, 4 Drawing Sheets

STRUCTURE AND METHOD FOR DIMINISHING DELAMINATION OF PACKAGED SEMICONDUCTOR DEVICES

FIELD

Embodiments of the invention are related in general to the field of semiconductor devices and processes, and more specifically to the structure and fabrication method of assembled semiconductor devices with mechanical features for reducing the risk of delamination of packaged devices.

DESCRIPTION OF RELATED ART

Moisture-induced failures of plastic packaged semiconductor devices have been observed and investigated for many years. It is well known that plastic packages made, for instance, by epoxy-based molding compounds can be penetrated by discrete water molecules within a time period of about one day. However, this penetration does not lead to a problematic situation as long as there is good adhesion inside the package between the plastic compound and the device components (semiconductor chip, metallic leadframe, substrate, etc.), and the penetrated water molecules cannot accumulate to form films of water on free surfaces.

In contrast, when some interfacial delamination has happened and water films have been able to form, quick rises of temperature may vaporize the water and initiate expansive internal pressures between the components and the package material. The expansive pressure may be high enough to bulge the package material at thin spots and eventually cause a crack through the material of the package. As an example, the temperature may rise quickly beyond the water boiling point when the packaged device is heated in order to reflow the device solder balls for attaching the device to a board. In the literature, the phenomenon of local package cracking by steam pressure has been dubbed popcorn effect. With the observed device failures, the popcorn effect has been a frustrating reliability problem for many years.

A variety of methods have been tried to prevent device delamination and package cracking by enhancing adhesion between the different device components (package compound, semiconductor chip, substrate, leadframe, etc.). Among the efforts have been chemically purifying the molding compounds; activating leadframe metal surfaces, for instance by plasma, just prior to the molding process; enhancing the affinity of leadframe metals to polymeric compounds by oxidizing the base metal or by depositing special metal layers (such as rough tin); coining the leadframes for creating dimples and other three-dimensional surface features and roughness for improved interlocking of the package material with the surfaces of the enclosed parts. However, the success of all these efforts has only been partial and limited.

SUMMARY

It is well known that the market for semiconductor products is very competitive. Consequently, there is persistent pressure on the manufacturer to be the first one to offer a new product; he must try to shorten the product introduction and the time-to-market for a new product. On the other hand, the manufacturer is offered a continuous flow of new materials and new methods to choose from. These innovations and novelties have their own technology introduction schedule. For packaged semiconductor products, proper selection of package structure, materials and processes aims at enhancing performance and controlling cost, aspects such as high product reliability and life expectancy must remain unchanged.

Today's majority of semiconductor products is fabricated as plastic-encapsulated devices. They employ a number of different materials, which make the devices vulnerable to the phenomenon of delamination between the package material and the encapsulated device. Further, market pressure for product introduction makes time-consuming validation of materials and manufacturability ever more complicated. While the traditional way of allowing more area to achieve strong adhesion, the ongoing market trend of miniaturizing semiconductor devices seems to leave ever less area for enhancing adhesion between encapsulation compound and enclosed parts of a device, and thus for controlling delamination.

Rather than solely focusing on enhancing adhesion between package and assembled device, applicant found a solution to drastically diminish delamination between package and assembled device, when he discovered a low-cost, readily available and flexible method of creating mechanical obstacles against delamination by extending and modifying the well-controlled wire bonding technology. Based on the strength of diffusion bonds, a plurality of mechanical anchor studs are created in quick sequence, which offer additional surface area to promote adhesion. Some studs may be arranged sequentially in the plane of the leadframe, others may be created as vertical stacks. The effectiveness of studs can be enhanced by adding wire arches spanned by the same wire bonding capillary forming the studs. The arches act as mold locks after curing the molding compound.

DETAILED DESCRIPTION OF THE PREFERRED EMBODIMENTS

Figure 1:
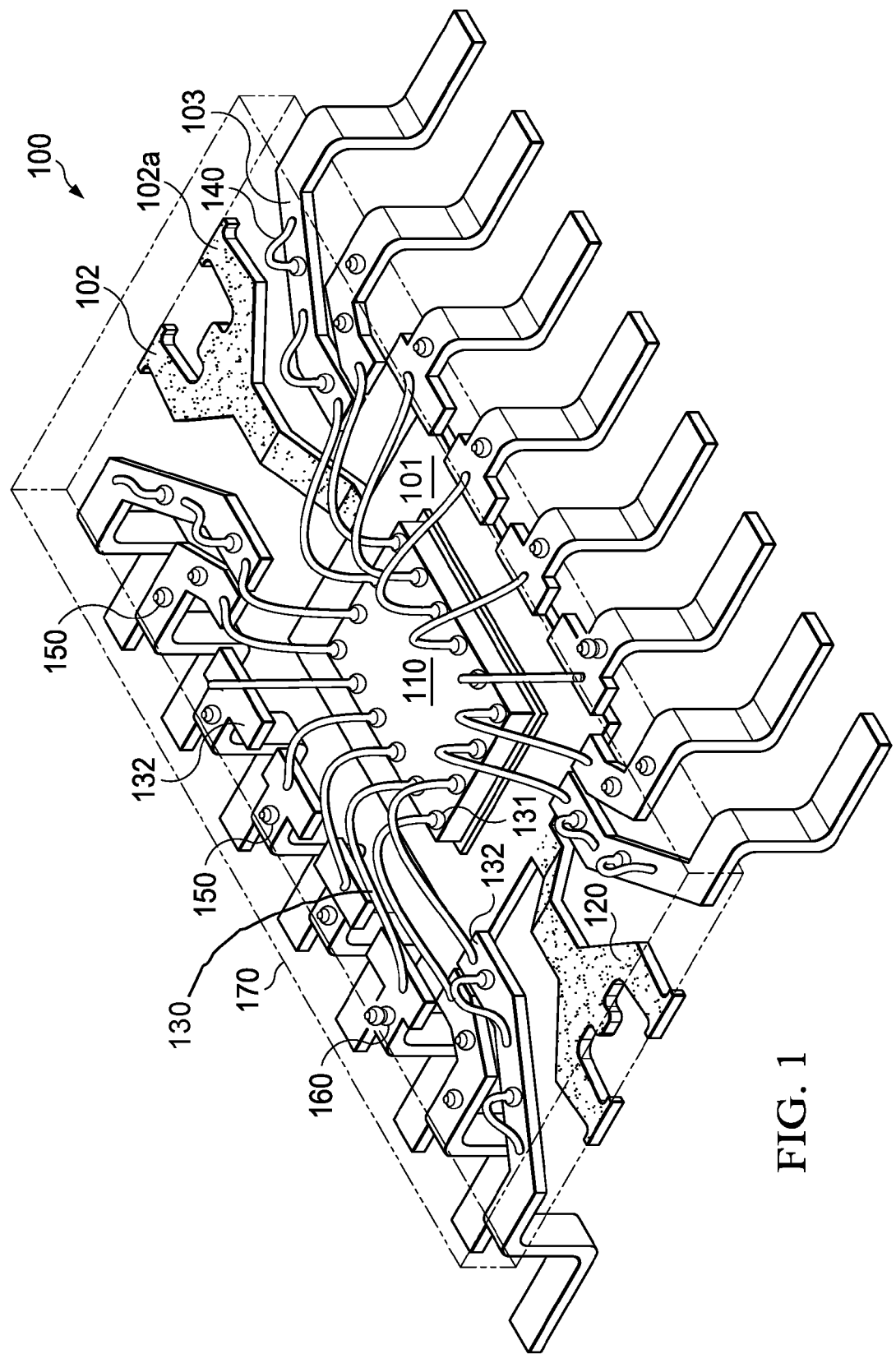
FIG. 1 shows a perspective view of a packaged semiconductor device including delamination-impeding objects according to the invention.

Embodiments of the invention are found in devices with semiconductor chips assembled on a support such as a metallic leadframe or a laminated substrate and encapsulated in a package of a polymeric compound. FIG. 1 illustrates an exemplary embodiment comprising a plastic packaged semiconductor device generally designated 100 with a substrate realized as a metallic leadframe. The leadframe includes a pad 101 for assembling a semiconductor chip 110, tie bars 102 connecting pad 101 to the sidewall of the package, and a plurality of leads 103. It should be noted that herein the tie bars are referred to as straps. The chip terminals are connected to the leads 103 by bonding wires 130, which include ball bond 131 and stitch bond 132. In the example of FIG.

1, leads 103 are shaped as cantilevered leads; in other embodiments, the leads may have the shape of flat leads as used in Quad Flat No-Lead (QFN) devices or in Small Outline No-Lead (SON) devices. Along their longitudinal extension, straps 102 of the exemplary device in FIG. 1 include bendings and steps, since pad 101 and leads 103 are not in the same plane. In other devices, straps 102 are flat and planar, because pad 101 and leads 103 are in the same plane.

Leadframes are preferably made from a flat sheet of a base metal, which is selected from a group including copper, copper alloys, aluminum, aluminum alloys, iron-nickel alloys, and Kovar. For many devices, the parallel surfaces of the leadframe base metal are treated to create strong affinity for adhesion to plastic compound, especially molding compounds. As an example, the surfaces of copper leadframes may be oxidized, since copper oxide surfaces are known to exhibit good adhesion to molding compounds. Other methods include plasma treatment of the surfaces, or deposition of thin layers of other metals on the base metal surface. As an example for copper leadframes, plated layers of tin have been used, or a layer of nickel (about 0.5 to 2.0 µm thick) followed by a layer of palladium (about 0.01 to 0.1 µm thick) optionally followed by an outermost layer of gold (0.003 to 0.009 µm thick).

Figure 2:
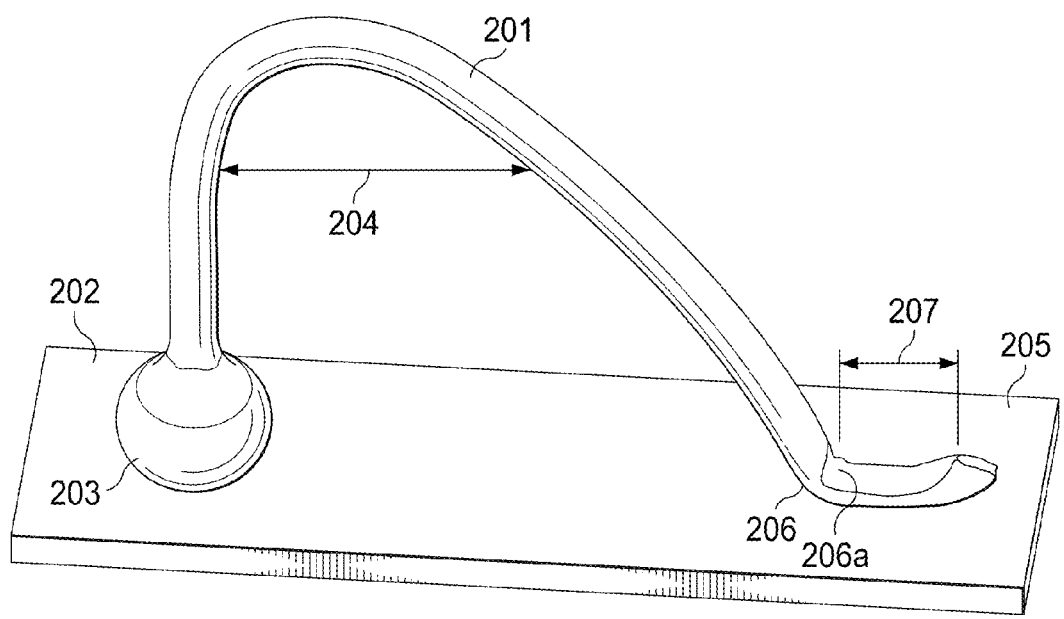
FIG. 2 illustrates an enlarged perspective view of a wire bond including a ball bond and a stitch bond.

As indicated in FIG. 1, device 100 uses wire bonding, specifically ball bonding, for electrically interconnecting chip terminals to leads. A typical ball bond is illustrated in FIG. 2. The wires 201, made of copper, gold, or aluminum, have diameters between about 15 and 33 µm. A wire bonding process may begin with positioning the semiconductor chip on a heated pedestal to raise the temperature to between 150 and 300° C. For copper and aluminum wires, ball formation and bonding may need to be performed in a reducing atmosphere such as dry nitrogen gas with a few percent hydrogen gas.

The wire is strung through the capillary of an automated bonder. A capillary is an elongated tube of an inert material such as a ceramic with a fine bore (the capillary in the strict sense) suitable for guiding a metal wire in the 15 to 33 µm diameter range. At the wire end extruding from the capillary tip, a free air ball is created by melting the wire end using either a flame or a spark technique. The ball has a typical diameter from about 1.2 to 1.6 wire diameters. The capillary is moved towards an attachment pad 202; for a chip terminal, the pad may be an alloy of aluminum and copper, for a pad of the leadframe, the pad may consist of the leadframe base metal or include one of the coating metal discussed above. The soft ball is pressed against the metallization of the pad by a compression force, often combined with ultrasonic movement of the ball relative to the pad, transmitting ultrasonic energy.

The compression (also called Z— or mash) force is typically between about 17 and 75 gram-force/cm² (about 1670 to 7355 Pa); the ultrasonic time between about 10 and 30 ms; the ultrasonic power between about 20 and 50 mW. The bonding process results in a metal nail head or squashed ball 203.

For wire bond 130, the attachment process of squashing free air balls against the metal (aluminum) of chip bond pads creates layers of intermetallic compounds of a total thickness between about 50 and 100 nm. On the other hand for wire bonds 140, the attachment process of squashing free air balls against the metal (palladium or gold) of plated leads creates metal interdiffusion. Metal interdiffusion is also the process which provides strength to stitch bonds, where ultrasonic agitation is not provided. It should be pointed out that herein this type of bond is referred to as "diffusion bond" (see also FIG. 4), in distinction to intermetallic bond.

After the ball attachment, the capillary may break off the wire, or the capillary with the wire may be lifted to span an arch 204 from the ball 203 to a pad 205 on a substrate or a leadframe. When the wire touches the pad surface, the capillary tip is pressed against the wire in order to flatten it and thus to form a stitch bond 206, sometimes referred to as a wedge bond. For substrate-based pads, the bonding temperature is typically about 160° C.; for leadframe-based pads, the bonding temperature may be between 240 and 260° C. The bonding force is typically in the range from about 50 to 150 gram-force, and the ultrasonic energy in the range from about 80 to 180 mA. The attachment process forms metal interdiffusions or welds. Based on the geometric shape of the capillary tip, the capillary leaves an imprint 207 in the flattened portion of the attached wire. The wire portion 206 with the transition from the round wire to the flattened wire is bent and is called the heel of the stitch bond; the binding has a vertex 206a.

The capillary rises again to a height sufficient to display a length of wire with enough metal to form the next ball. Then, a tear method is initiated to break the wire near the end of the stitch bond and leave the exposed wire length dangling from the capillary tip ready for the next ball-forming melting step. Various wire-breaking methods are commonly employed, among them the so-called clamp-tear method and the table-tear method.

Standardized bond pull tests, with pulls measured in gram-force, are used to gauge the strength of the ball bonds and the stitch bonds. The pull tests to measure the quality of the bonds may be repeated by pull tests to measure the reliability after any of the numerous standardized accelerated life tests, moisture tests, and electrical stress tests.

Figure 3:
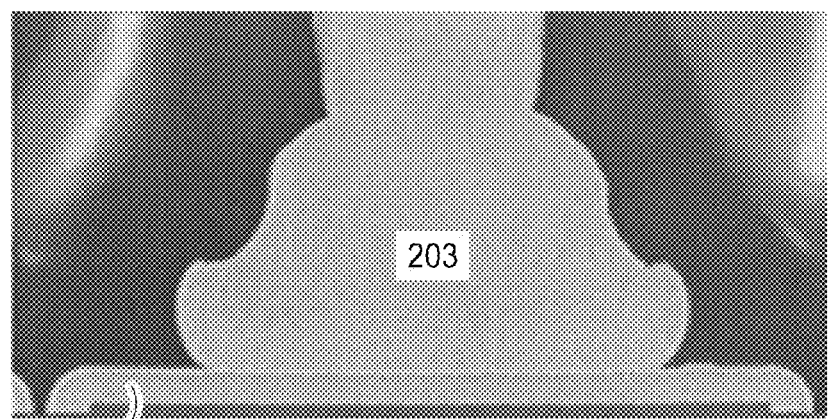
FIG. 3 shows a micrograph of a ball bond cross section; the squashed ball is shown attached to a bondable metal surface.
Figure 4:
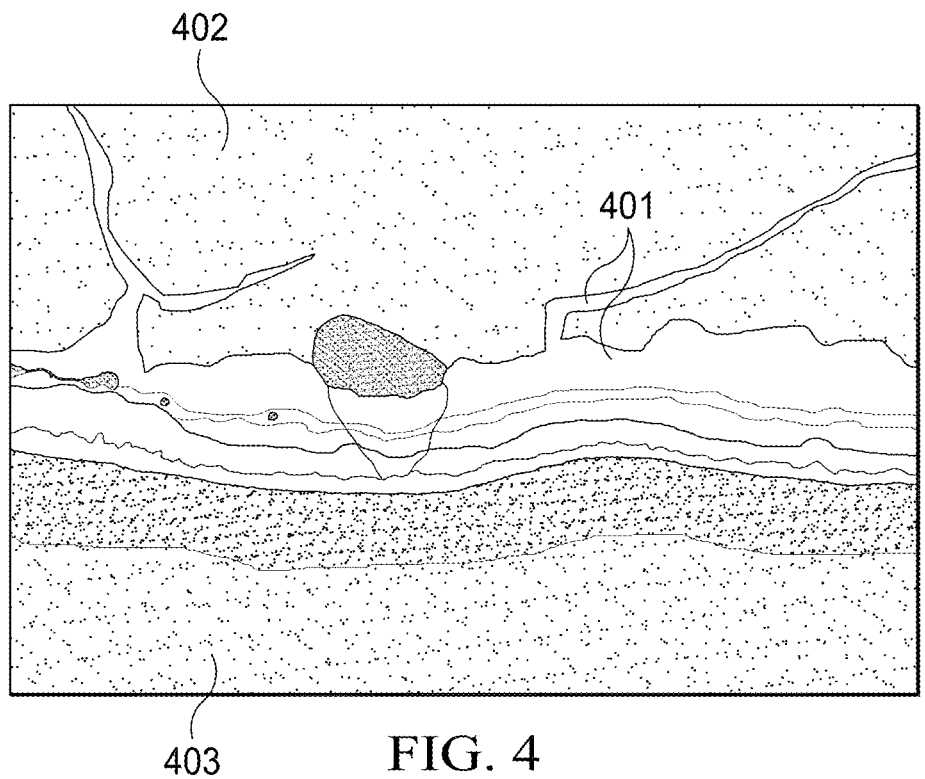
FIG. 4 depicts an enlarged cross section of a portion of the ball bond of FIG. 3, illustrating metal interdiffusion as the basis of diffusion bonds.

FIG. 3 shows a squashed ball 203 of a copper wire bond to a substrate pad 301 made of copper as the base metal and a coating including a nickel layer in contact with the copper base, a palladium layer on the nickel and a gold layer on the palladium. The cross section of FIG. 4 illustrates the interdiffusion of palladium metal (401) into the copper squashed ball 402 as the result of the bonding process to the copper substrate 403.

Referring now to FIG. 1, in addition to the wire bond 130 the exemplary embodiment 100 includes a package 170 for encapsulating chip 110 and wire bonds 130, which connect the chip terminals to respective leads. Preferably, package 170 is made of a polymeric compound such as an epoxy-based thermoset polymer and formed in a molding process. Satisfactory operation of most semiconductor devices requires reliable adhesion between the packaging compound and the encapsulated parts since delamination would degrade the capability to keep moisture and impurities out and to guarantee uninterrupted heat dissipation.

According to the invention, the embodiment of FIG. 1 includes a plurality of bonding wire features aiming at preventing delamination of the package from the assembled device. As FIG. 1 shows, some leads 103 with sufficient length have one or more additional wire loops 140 with ball bonds and stitch bonds to the leads Both types of bonds are based on metal interdiffusion of lead metal and wire metal for bond strength. Consequently, the bonds together with the arching wire span offer mechanical obstacles against relative expansion and contraction between polymeric compound and leadframe.

It is a technical advantage confirmed by experience that the impediment represented by the mechanical barriers of ball bonds and wire loops is strong enough to prevent delamination even in highly accelerated stress tests (HAST at elevated temperature and humidity). The quick and easy method of affixing ball bonds and stitch bonds together with the arches of spanned wires is thus a rapid way of confirming satisfactory prevention of delamination between encapsulation compounds and leadframes, and substrate materials generally.

Another feature illustrated in FIG. 1 are obstacles 150 realized by numerous solitary ball bonds, i.e. squashed ball bonds or studs with wire stumps of various lengths left over from braking off bonding wires in the heat-affected zone. These squashed balls look generally like the exemplary stud 203 shown in FIG. 3.

It is a technical advantage that squashed balls 150 need only little space and can thus be placed easily close to the stitch bonds of wire connections 130. In addition, studs 150 can be placed on any available area of leads 103 inside of package 170. Experience has shown that the impediment represented by the mechanical barriers of squashed ball bonds or studs is strong enough to prevent delamination even in highly accelerated stress tests (HAST at elevated temperature and humidity). When only little space is available, the quick and easy method of affixing ball bonds is thus a rapid way of confirming satisfactory prevention of delamination between encapsulation compounds and substrate materials.

Figure 5:
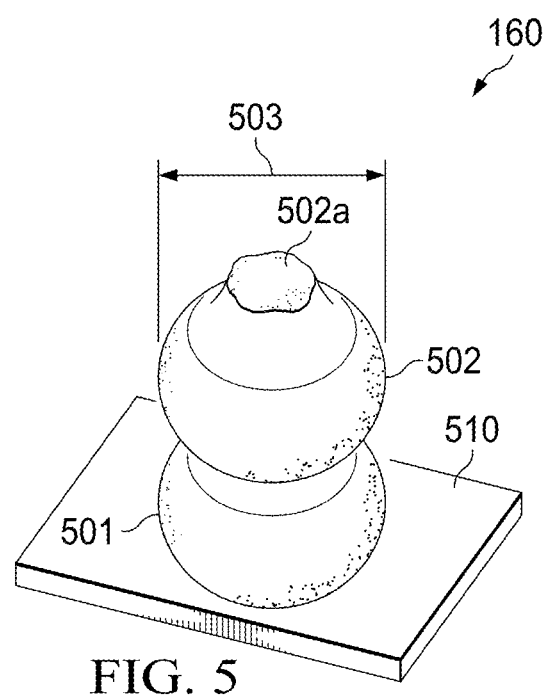
FIG. 5 illustrates an enlarged perspective view of a stacked ball bond as an impediments against delamination.

Yet another feature of the invention is obstacle 160 indicated in FIG. 1 and in more detail in FIG. 5. The exemplary obstacle 160 illustrated in FIG. 5 shows a first (501) and a second (502) free air ball created by an automated wire bonder and somewhat flattened by pressing them against a substrate 510. The diameter 503 may be preferably in the range from about 15 to 40 μm. In the preferred embodiment, the free air balls are made from bonding wires including copper; other options are wires including gold or aluminum. In a customary automated wire bonder, the wire (diameter between preferably between about 15 and 30 μm) is strung through a capillary. At the tip of the wire, a free air ball is created using either a flame or a spark technique. The ball may have a typical diameter from about 1.2 to 1.6 wire diameters. The capillary is moved towards the substrate 510 and the ball is pressed against the substrate. In FIG. 5, the second ball 502 is pressed on top of the first ball 501 in a substantially linear sequence, preferably so that the center-to-center line is approximately normal to the equatorial plane of the balls. Slight deviations from the vertical arrangement can be tolerated. The flame-off tip 502*a* of the second ball 302 is clearly visible.

Similar to the embodiment using a single squashed ball 150, it is a technical advantage that a vertical stack of squashed balls 160 need only little space and can thus be placed easily close to the stitch bonds of wire connections 130. In addition, stack 160 can be placed on any available area of leads 103 inside of package 170. Experience has shown that the impediment represented by the mechanical barriers of stacked squashed ball bonds or studs is strong enough to prevent delamination even in HAST at elevated temperature and humidity.

It is a technical advantage of the invention that packaged devices with any substrate can receive obstacles against delamination such as studs 150, stacked studs 160, and wire spans 140 including ball bonds and stitch bonds, as long as the substrate surface has a metallurgy with affinity to adhesion. For substrates realized as leadframes, surface layers including nickel followed by palladium (optionally followed by gold) provide such adhesion affinity. For substrates realized as insulating laminates, spot-metallization including layers of nickel and palladium provide the adhesion affinity.

Figure 6:
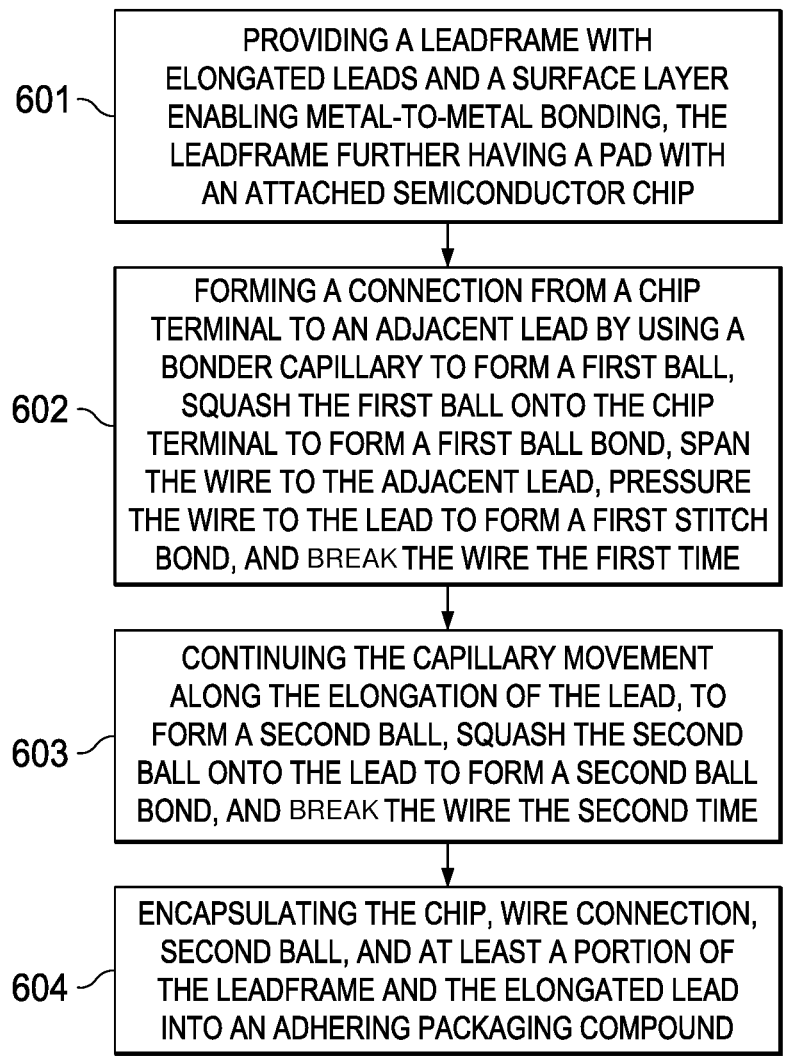
FIG. 6 displays a diagram of the process flow for fabricating a packaged semiconductor device with impediments against package delamination.

The method described above of fabricating a packaged semiconductor with obstacles diminishing delamination of the package is summarized in FIG. 6. In process 601, a leadframe is provided, which has elongated leads such as lead 103 in FIG. 1. The leadframe is made of a base metal plated with a layer enabling metal-to-metal bonding, and the leadframe further has a pad with an attached semiconductor chip.

In process 602, a connection (such as 130 in FIG. 1) is formed from a chip terminal to an adjacent lead by using the capillary of a metal wire bonder to form a first free air ball, squash the first ball onto the chip terminal to form a first ball bond (131 in FIG. 1; usually based on creating intermetallics) and span the wire to the adjacent lead, pressure the wire to the lead to form a first stitch bond (132 in FIG. 1), and break the wire the first time.

Next, in process 603, the capillary movement is continued along the elongation of the lead; during the movement, the capillary is used to form a second free air ball, squash the second ball onto the lead to form a second ball bond (150 in FIG. 1, which is a diffusion bond), and break the wire the second time. The stud thus created represents an obstacle against delamination of an encapsulation (see below) from the assembled device. The process of creating the obstacle can be repeated numerous times. Further the effectiveness of the obstacle can be enhanced by adding a wire arch to the obstacle, which is attached to the lead as a stitch bond.

In process 604, the chip, wire connection, second ball, and at least a portion of the leadframe and the elongated lead are encapsulated into a packaging compound, which adheres to the materials of the encapsulated entities. A preferred choice is an epoxy-based thermoset molding compound, which can be formulated for good adhesion to metallic leadframes.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to active semiconductor devices with low and high pin counts, such as transistors and integrated circuits, but also to combinations of active and passive components on a leadframe pad.

As another example, the invention applies not only to silicon-based semiconductor devices, but also to devices using gallium arsenide, gallium nitride, silicon germanium, and any other semiconductor material employed in industry. The invention applies to leadframes with cantilevered leads and to QFN and SON type leadframes.

As another example, the invention applies to leadframes, laminated substrates, and any other substrate or support structure, which includes a metallurgical surface configuration suitable for welding and metal interdiffusion.

It is therefore intended that the appended claims encompass any such modifications or embodiments.

I claim:

1. A semiconductor device comprising:
    a leadframe having a pad and elongated leads spaced from the pad by a gap, the leadframe made of a base metal plated with a layer enabling metal-to-metal bonding;
    a semiconductor chip attached to the pad, the chip having terminals;
    a metallic wire connection, comprising a wire metal, from a terminal to a respective elongated lead, the connection including a first ball bond by a first squashed ball attached to the terminal, and a first stitch bond attached to the respective elongated lead;

a second squashed ball, of the wire metal, attached to the respective elongated lead as a second ball bond adjacent to the first stitch bond; and a package of a polymeric compound encapsulating the chip, wire connection, second ball and a first portion of the respective elongated lead, and wherein a second portion of the respective elongated lead extends beyond the package, the compound adhering to the materials of the encapsulated entities.

2. The device of claim 1 further including a wire arch spanning from the second squashed ball along the respective elongated lead to a second wire stitch bond attached to the respective elongated lead.

3. The device of claim 1 further including a squashed ball bond having an additional squashed ball vertically stacked on top of the bottom ball.

4. The device of claim 2 further including a plurality of additional squashed balls, wire arches, and wire stitch bonds along the respective elongated lead.

5. The device of claim 1 wherein the base metal is selected from a group including copper, copper alloys, aluminum, aluminum alloys, iron-nickel alloys, and Kovar.

6. The device of claim 5 wherein the plated layer enabling metal-to-metal bonding includes a layer of nickel plated on the base metal and a layer of palladium plated on the nickel layer.

7. The device of claim 6 further including a layer of gold plated on the palladium layer.

8. A semiconductor device comprising:

an insulating substrate having on its surface elongated metallized traces of a metallurgy enabling metal-to-metal bonding, the substrate further having a pad with an attached semiconductor chip, the chip having terminals;

a metallic wire connection, comprising a wire metal, from a terminal to a respective elongated metallized trace, the connection including a first ball bond by a first squashed ball attached to the terminal, and a first stitch bond attached to the trace;

a second squashed ball, of the wire metal, attached to the respective elongated metallized trace as a second ball bond adjacent to the first stitch bond; and a package of a polymeric compound encapsulating the chip, wire connection, second ball and a first portion of the respective elongated metallized trace, and wherein a second portion of the respective elongated metallized trace extends beyond the package, the compound adhering to the materials of the encapsulated entities.

9. The device of claim 8 further including a wire arch spanning from the second squashed ball along the respective elongated metallized trace to a second wire stitch bond attached to the trace.

10. A method for fabricating semiconductor devices comprising:

providing a leadframe having elongated leads, the leadframe made of a base metal plated with a layer enabling metal-to-metal bonding, the leadframe further having a pad with an attached semiconductor chip;

forming a connection from a chip terminal to an adjacent lead by using the capillary of a metal wire bonder to form a first ball, squash the first ball onto the chip terminal to form a first ball bond, span the wire to the adjacent lead, pressure the wire to the lead to form a first stitch bond, and break the wire the first time;

continuing the capillary movement along elongation of the elongated lead, using the capillary to form a second ball, squash the second ball onto the elongated lead to form a second ball bond, and break the wire the second time; and encapsulating the chip, wire connection, second ball, and at least a portion of the leadframe and a first portion of the elongated lead into a packaging compound adhering to the materials of the encapsulated entities and such that a second portion of the elongated lead extends beyond the packaging compound.

11. The method of claim 10 wherein the base metal is selected from a group including copper, copper alloys, aluminum, aluminum alloys, iron-nickel alloys, and Kovar.

12. The method of claim 11 wherein the plated layer enabling metal-to-metal bonding includes a layer of nickel plated on the base metal and a layer of palladium plated on the nickel layer.

13. The method of claim 12 further including a layer of gold plated on the palladium layer.

14. The method of claim 10 wherein the second ball bond is based on forming metal interdiffusions.

15. The method of claim 10 further including, before breaking the wire the second time, the process of forming a wire arch along elongation of the elongated lead and a second stitch bond onto the lead.

16. The method of claim 10 further including repetitions of the processes of forming a ball, affixing the ball to the elongated lead, and breaking the wire.

17. The method of claim 16 further including, before each breaking of the wire, a repeated process of forming a wire arch along elongation of the elongated lead and a stitch bond to the elongated lead.

18. A method for fabricating semiconductor devices comprising:

providing an insulating substrate having on its surface elongated metallized traces of a metallurgy enabling metal-to-metal bonding, the substrate surface further having a pad with an attached semiconductor chip;

forming a connection from a chip terminal to an adjacent elongated metallized trace by using a capillary of a metal wire bonder to form a first ball, squash the first ball onto the chip terminal to form a first ball bond, span the wire to the adjacent elongated metallized trace, pressure the wire to the elongated metallized trace to form a first stitch bond, and break the wire the first time;

continuing the capillary movement along elongation of the elongated metallized trace, using the capillary to form a second ball, squash the second ball onto the elongated metallized trace to form a second ball bond, and break the wire the second time; and encapsulating the chip, wire connection, second ball, and at least a portion of the substrate and a first portion of the elongated metallized trace into a packaging compound adhering to the materials of the encapsulated entities and such that a second portion of the elongated metallized trace extends beyond the packaging compound.

19. The method of claim 18 further including, before breaking the wire the second time, the process of forming a wire arch along elongation of the elongated metallized trace and a second stitch bond onto the elongated metallized trace.

20. The device of claim 1 wherein the elongated leads comprise a plurality of elongated leads, and further comprising a respective squashed ball on each of the plurality of leads proximate an edge of the polymeric compound, the compound encapsulating each respective squashed ball.

* * * * *